(12) United States Patent
Wisniewski

(10) Patent No.: US 10,923,889 B2
(45) Date of Patent: Feb. 16, 2021

(54) GANGING A PLURALITY OF WALL MOUNTED ELECTRIC DEVICES

(71) Applicant: Crestron Electronics, Inc., Rockleigh, NJ (US)

(72) Inventor: Stan Wisniewski, Pompton Plains, NJ (US)

(73) Assignee: Crestron Electronics, Inc., Rockleigh, NJ (US)

(*) Notice: Subject to any disclaimer, the term of this patent is extended or adjusted under 35 U.S.C. 154(b) by 417 days.

(21) Appl. No.: 15/926,006

(22) Filed: Mar. 20, 2018

(65) Prior Publication Data

US 2019/0115731 A1  Apr. 18, 2019

Related U.S. Application Data

(60) Provisional application No. 62/573,538, filed on Oct. 17, 2017.

(51) Int. Cl.
*H02G 3/08* (2006.01)
*H02B 1/48* (2006.01)
(Continued)

(52) U.S. Cl.
CPC ............... *H02B 1/48* (2013.01); *H01H 13/86* (2013.01); *H02G 3/12* (2013.01); *H05K 5/0017* (2013.01);
(Continued)

(58) Field of Classification Search
CPC ... H02B 1/28; H02B 1/26; H02B 1/40; H02B 1/42; H02B 1/46; H01H 13/86;
(Continued)

(56) References Cited

U.S. PATENT DOCUMENTS 1,717,871 A    6/1929  Both
4,612,412 A *  9/1986  Johnston ................ H02G 3/086
                                                          174/57
(Continued)

OTHER PUBLICATIONS

Lutron Electronics Co., Inc., Palladiom Brochure, P/N 367-2552 Rev E, Dec. 2015.
(Continued)

*Primary Examiner* — Angel R Estrada
(74) *Attorney, Agent, or Firm* — Crestron Electronics, Inc.

(57) ABSTRACT

Apparatus, system, and method for ganging a plurality of wall mounted control devices, such as keypads. Particularly, an assembly of ganged control devices is provided comprising a pair of adjacently positioned control devices each adapted to control at least one function of at least one associated load. Each control device comprises a housing assembly and at least one button attached to the housing assembly. The housing assembly comprises a pair of oppositely disposed side surfaces each comprising a pair of vertically aligned recesses. Each recess comprises a tapered inner side wall. The assembly further comprises an alignment plate comprising a vertical wall adapted to be positioned in between the pair of control devices and a pair of vertically aligned tabs traversely extending from oppositely disposed side surfaces of the vertical wall. Each tab comprises a tapered outer side wall. The tabs are sized, shaped, and positioned to be inserted into the recesses such that the tapered outer side walls of the tabs form a friction fit with the tapered inner side walls of the recesses to removably attach and align the pair of control devices.

18 Claims, 11 Drawing Sheets

(51) Int. Cl.
*H05K 5/00* (2006.01)
*H05K 5/02* (2006.01)
*H01H 13/86* (2006.01)
*H02G 3/12* (2006.01)
*H01H 13/83* (2006.01)

(52) U.S. Cl.
CPC ......... *H05K 5/0021* (2013.01); *H05K 5/0204* (2013.01); *H05K 5/0217* (2013.01); *H01H 13/83* (2013.01); *H01H 2219/036* (2013.01); *H01H 2223/028* (2013.01); *H01H 2223/032* (2013.01)

(58) Field of Classification Search
CPC ............. H01H 13/83; H01H 2219/036; H01H 2223/028; H01H 2223/032; H02G 3/12; H02G 3/10; H02G 3/08; H02G 3/081; H05K 5/0017; H05K 5/0021; H05K 5/0204; H05K 5/0217
USPC ....... 174/480, 50, 53, 57, 58, 494, 503, 535, 174/542, 520, 559, 560, 561, 562, 563, 174/59; 220/3.2–3.9, 4.02
See application file for complete search history.

(56) References Cited

U.S. PATENT DOCUMENTS

| | | |
|---|---|---|
| D287,717 S | 1/1987 | Farwell et al. |
| D297,404 S | 8/1988 | Yandek et al. |
| 4,783,581 A | 11/1988 | Flowers et al. |
| 4,803,380 A | 2/1989 | Jacoby, Jr. et al. |
| 4,875,880 A | 10/1989 | Welch et al. |
| 4,972,045 A | 11/1990 | Primeau |
| 5,073,681 A | 12/1991 | Flubben et al. |
| D325,559 S | 4/1992 | Rosenbaum et al. |
| D330,013 S | 10/1992 | Wunsch |
| D335,867 S | 5/1993 | Rowen |
| D336,744 S | 6/1993 | Kahn et al. |
| D336,894 S | 6/1993 | Zaretsky et al. |
| D351,099 S | 10/1994 | Flasz |
| 5,457,286 A | 10/1995 | Flasz |
| 5,696,350 A | 12/1997 | Anker |
| 5,700,978 A | 12/1997 | Huff |
| 5,736,965 A | 4/1998 | Mosebrook et al. |
| 5,744,750 A | 4/1998 | Almond |
| D394,042 S | 5/1998 | Hwang |
| 5,961,345 A | 10/1999 | Finn et al. |
| 5,982,103 A | 11/1999 | Mosebrook et al. |
| 5,999,083 A | 12/1999 | Kordecki |
| 6,005,189 A | 12/1999 | Anker |
| D436,930 S | 1/2001 | Butler |
| D437,585 S | 2/2001 | Mayo et al. |
| D441,722 S | 5/2001 | Pattberg |
| D450,043 S | 11/2001 | Mosebrook |
| 6,380,696 B1 | 4/2002 | Sembhi et al. |
| 6,421,941 B1 | 7/2002 | Finke et al. |
| 6,545,434 B2 | 4/2003 | Sembhi et al. |
| D475,024 S | 5/2003 | Bennett et al. |
| 6,593,530 B2 | 7/2003 | Hunt |
| 6,943,297 B2 | 9/2005 | Capella |
| D518,794 S | 4/2006 | Hedderich et al. |
| D519,939 S | 5/2006 | Hedderich et al. |
| D539,758 S | 4/2007 | Blair et al. |
| D543,951 S | 6/2007 | Blair et al. |
| 7,247,792 B2 | 7/2007 | Tufano et al. |
| D549,710 S | 8/2007 | Hynecek et al. |
| D563,326 S | 3/2008 | Patel et al. |
| D564,457 S | 3/2008 | Billings et al. |
| 7,432,463 B2 | 10/2008 | Clegg et al. |
| 7,435,903 B2 | 10/2008 | Tufano et al. |
| D581,369 S | 11/2008 | Egea |
| D596,143 S | 7/2009 | Felegy, Jr. et al. |
| 7,575,470 B2 | 8/2009 | Pyrros |
| 7,576,285 B1 | 8/2009 | Savicki, Jr. |
| 7,586,040 B1 | 9/2009 | Bala et al. |
| D602,446 S | 10/2009 | Felegy, Jr. et al. |
| D606,030 S | 12/2009 | Felegy, Jr. et al. |
| D606,500 S | 12/2009 | Snyder et al. |
| D614,589 S | 4/2010 | Altonen et al. |
| D620,457 S | 7/2010 | Maurer et al. |
| 7,781,690 B2 | 8/2010 | Ishii |
| D626,092 S | 10/2010 | Clymer et al. |
| D627,309 S | 11/2010 | Snyder et al. |
| D631,856 S | 2/2011 | Altonen et al. |
| D633,448 S | 3/2011 | Biery et al. |
| D633,874 S | 3/2011 | Feldstein et al. |
| D636,347 S | 4/2011 | Felegy, Jr. et al. |
| D636,351 S | 4/2011 | Rodriguez et al. |
| D638,375 S | 5/2011 | Clymer et al. |
| D638,805 S | 5/2011 | Clymer et al. |
| 7,939,756 B2 | 5/2011 | Daniels et al. |
| D645,413 S | 9/2011 | Lind, III et al. |
| D647,489 S | 10/2011 | Lind, III et al. |
| D649,123 S | 11/2011 | Jacoby et al. |
| D649,125 S | 11/2011 | Clymer et al. |
| D649,520 S | 11/2011 | Jacoby et al. |
| D654,030 S | 2/2012 | Hoffknecht et al. |
| 8,242,364 B1 | 8/2012 | Shotey et al. |
| D669,866 S | 10/2012 | Gilbert et al. |
| D673,510 S | 1/2013 | Felegy, Jr. et al. |
| 8,350,154 B1 | 1/2013 | Shotey |
| 8,420,956 B2 | 4/2013 | Alderson et al. |
| D687,390 S | 8/2013 | McDonald et al. |
| D691,097 S | 10/2013 | Lind, III et al. |
| D694,196 S | 11/2013 | Felegy, Jr. et al. |
| D694,716 S | 12/2013 | Felegy, Jr. et al. |
| 8,664,526 B2 * | 3/2014 | Charbonneau ........... H02G 3/16 174/59 |
| 8,669,471 B2 * | 3/2014 | Temblador ............. H02G 3/126 174/50 |
| D703,623 S | 4/2014 | Altonen et al. |
| D705,741 S | 5/2014 | Porter et al. |
| D706,731 S | 6/2014 | Altonen et al. |
| D706,732 S | 6/2014 | Altonen et al. |
| D711,837 S | 8/2014 | Clymer et al. |
| D711,838 S | 8/2014 | Spira |
| D714,231 S | 9/2014 | Sparks et al. |
| D714,232 S | 9/2014 | Chambers et al. |
| D714,234 S | 9/2014 | Altonen et al. |
| D714,736 S | 10/2014 | O'Donnell |
| D715,231 S | 10/2014 | O'Donnell |
| D717,742 S | 11/2014 | Larkin et al. |
| D720,306 S | 12/2014 | Altonen et al. |
| D721,659 S | 1/2015 | Rodriguez et al. |
| D726,663 S | 4/2015 | Clymer et al. |
| D733,073 S | 6/2015 | Larkin et al. |
| D733,076 S | 6/2015 | Jacoby et al. |
| 9,048,647 B2 | 6/2015 | Myers et al. |
| D733,668 S | 7/2015 | Altonen et al. |
| D734,277 S | 7/2015 | Jacoby et al. |
| D736,718 S | 8/2015 | Spira |
| D737,154 S | 8/2015 | Jacoby et al. |
| D737,222 S | 8/2015 | Altonen et al. |
| D739,830 S | 9/2015 | Spira |
| D750,981 S | 3/2016 | Jacoby et al. |
| 9,300,121 B2 | 3/2016 | Myers et al. |
| D755,732 S | 5/2016 | Moeller |
| D755,739 S | 5/2016 | Altonen et al. |
| D762,590 S | 8/2016 | Clymer et al. |
| 9,578,720 B2 | 2/2017 | Camden et al. |
| 9,609,719 B2 | 3/2017 | Camden et al. |
| 9,652,979 B2 | 5/2017 | Camden et al. |
| 9,679,696 B2 | 6/2017 | Bhutani et al. |
| D792,358 S | 7/2017 | Poulheim et al. |
| 9,699,864 B2 | 7/2017 | Camden et al. |
| 9,717,130 B2 | 7/2017 | Shivell et al. |
| 9,742,580 B2 | 8/2017 | Camden et al. |
| D797,545 S | 9/2017 | Poulheim et al. |
| D797,683 S | 9/2017 | Poulheim et al. |
| D797,684 S | 9/2017 | Poulheim et al. |
| 9,763,302 B2 | 9/2017 | McDonald et al. |
| D799,934 S | 10/2017 | Poulheim et al. |
| D800,669 S | 10/2017 | Poulheim et al. |

(56) References Cited

U.S. PATENT DOCUMENTS

| | | |
|---|---|---|
| D800,671 S | 10/2017 | Poulheim et al. |
| D800,672 S | 10/2017 | Poulheim et al. |
| 2005/0043907 A1 | 2/2005 | Eckel et al. |
| 2015/0346702 A1 | 12/2015 | Camden et al. |
| 2016/0069537 A1 | 3/2016 | Dimberg et al. |
| 2016/0073467 A1 | 3/2016 | McDonald et al. |
| 2016/0307714 A1 | 10/2016 | Bhate et al. |
| 2016/0353543 A1 | 12/2016 | Twaddell et al. |
| 2017/0053753 A1 | 2/2017 | Adams et al. |
| 2017/0169702 A1 | 6/2017 | Camden et al. |
| 2017/0229010 A1 | 8/2017 | Camden et al. |
| 2017/0237173 A1 | 8/2017 | Bhutani et al. |
| 2017/0238395 A1 | 8/2017 | Shivell et al. |
| 2017/0257927 A1 | 9/2017 | Camden et al. |

OTHER PUBLICATIONS

Crestron Electronics, Inc., CLWI-KPLCN, Specifications subject to change without notice. Revised Jun. 2, 2016.

Crestron Electronics, Inc., CLWI-KPLCN, In-Wall Lighting Keypad, Cresnet® Installation Guide, DOC. 7242A (2031639) Aug. 2013.

Lutron Electronics Co., Inc., PalladiomTM QS Keypads, Installation Instruction, P/N 041496 Rev. D, Oct. 2015.

Lutron Electronics Co., Inc., HomeWorks® QS Wired Palladiom™ Keypad, product specifications 369881d Nov. 23, 2015.

\* cited by examiner

GANGING A PLURALITY OF WALL MOUNTED ELECTRIC DEVICES

BACKGROUND OF THE INVENTION

Technical Field

Aspects of the embodiments relate to wall mounted control devices, and more specifically to apparatus, system, and method for ganging a plurality of wall mounted control devices, such as keypads.

Background Art

Wall mounted control devices, such as light switches, dimmers, keypads, or outlets, are normally mounted inside an electrical box. These devices typically comprise a housing in combination with a mounting bracket and a user interface, such as buttons. To gang a plurality of these devices next to each other, a multi gang electrical box is used. Typically, the mounting bracket of each control device includes oval holes disposed on its top and bottom that are used to attach each of the control devices to the electrical box using mounting screws. A multi gang faceplate is then secured to the control devices to hide the mounting screws and the opening to the electrical box. The multi gang faceplate generally includes a plurality of center holes each configured for receiving and exposing the user interface of one of the control devices.

However, in a multi-gang installation, the buttons of neighboring devices may not be perfectly aligned. This might not be as perceivable with a faceplate that includes spacing between neighboring buttons. However, this becomes unsightly in keypads where the buttons are closely disposed or where the faceplate does not provide any spacing between the buttons.

Accordingly, a need has arisen for an apparatus, system, and method for ganging and aligning a plurality of wall mounted control devices, such as keypads.

SUMMARY OF THE INVENTION

It is an object of the embodiments to substantially solve at least the problems and/or disadvantages discussed above, and to provide at least one or more of the advantages described below.

It is therefore a general aspect of the embodiments to provide an apparatus, system, and method for aligning a plurality of wall mounted control devices, such as keypads, which will obviate or minimize problems of the type previously described.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

DISCLOSURE OF INVENTION

According to one aspect of the embodiments, an assembly of ganged control devices is provided. The assembly comprises a pair of adjacently positioned control devices each adapted to control at least one function of at least one associated load. Each control device comprises a housing assembly and at least one button attached to the housing assembly. The housing assembly of each control device comprises a pair of oppositely disposed side surfaces each comprising a plurality of recesses. The assembly further comprises an alignment plate comprising a vertical wall adapted to be positioned in between the pair of control devices and a plurality of tabs traversely extending from oppositely disposed side surfaces of the vertical wall. The tabs are sized, shaped, and positioned for mating with the recesses in the side surfaces of the pair of control devices to removably attach and align the pair of control devices.

According to an embodiment, the plurality of recesses on each side surface of each control device comprise a pair of vertically aligned recesses, and wherein the plurality of tabs on each side surface of the alignment plate comprise a pair of vertically aligned tabs. The pair of vertically aligned recesses may be disposed proximate to a front side of each control device, wherein each control device further comprises a third recess disposed proximate to a rear side of each control device, and wherein each side surface of the alignment plate further comprises a third tab positioned for mating with the third recess on a corresponding side surface of a corresponding control device.

According to an embodiment, each recess comprises a tapered inner side wall and wherein each tab comprises a tapered outer side wall adapted to form a friction fit with the tapered inner side wall of a corresponding recess. According to an embodiment, the alignment plate is adapted to removably attach the pair of adjacently positioned control devices by having the plurality of tabs press fit into corresponding recesses in the control devices. According to an embodiment, the vertical wall of the alignment plate is sized and shaped to substantially correspond to a size and shape of one of the side surfaces of the control devices.

According to an embodiment, at least one button of one of the pair of control devices is adapted to be disposed adjacent to at least one button of another one of the pair of control devices forming substantially no space therebetween, wherein the alignment plate is adapted to align the adjacently disposed buttons. The assembly may further comprise a faceplate comprising a single opening sized and shaped to receive the buttons of the pair of adjacently disposed control devices. The front surface of each button may be adapted to be substantially flush with a front surface of the faceplate.

According to an embodiment, each side surface of the vertical wall of the alignment plate further comprise at least one bump extending therefrom in proximity to a rear edge of the vertical wall to compensate for a space created between the housing assemblies of the pair of adjacent control devices. According to an embodiment, the plurality of tabs comprise a substantially equal size that mate with the plurality of recesses that comprise a substantially equal size. According to another embodiment, at least one tab comprises a different size from the plurality of tabs that mates with at least one recess that comprises a different size from the plurality of recesses. According to an embodiment, the vertical wall of the alignment plate comprises a projecting portion projecting from a rear edge of the vertical wall adapted to provide a gripping surface. According to a further embodiment, the assembly further comprises at least one additional control device adapted to be removably attached to and aligned with the pair of control devices via at least one additional alignment plate.

According to another aspect of the embodiments, an assembly of ganged control devices is provided. The assembly comprises a pair of adjacently positioned control devices each adapted to control at least one function of at least one associated load. Each control device comprises a housing assembly and at least one button attached to the housing assembly. The housing assembly of each control device comprises a pair of oppositely disposed side surfaces each comprising a pair of vertically aligned recesses, wherein each recess comprises a tapered inner side wall. The assembly further comprises an alignment plate comprising a vertical wall adapted to be positioned in between the pair of control devices and a pair of vertically aligned tabs traversely extending from oppositely disposed side surfaces of the vertical wall, wherein each tab comprises a tapered outer side wall, wherein the tabs are sized, shaped, and positioned to be inserted into the recesses such that the tapered outer side walls of the tabs form a friction fit with the tapered inner side walls of the recesses to removably attach and align the pair of control devices.

According to a further aspect of the embodiments, a method is provides for ganging at least a pair of control devices each adapted to control at least one function of at least one associated load. The method comprising the steps of: (a) inserting a plurality of tabs that traversely extend from a first side surface of a vertical wall of an alignment plate into a plurality of recesses formed on a side surface of a housing assembly of a first control device; (b) inserting a plurality of tabs that traversely extend from a second side surface of the vertical wall of the alignment plate into a plurality of recesses formed on a side surface of a housing assembly of a second control device; and (iii) applying pressure to the pair of control devices toward each other such that they are secured by the alignment plate.

According to an embodiment, each recess comprises a tapered inner side wall and wherein each tab comprises a tapered outer side wall adapted to form a friction fit with the tapered inner side wall of a corresponding recess. Each control device may comprise at least one button attached to the housing assembly, wherein the at least one button of one of the pair of control devices is adapted to be disposed adjacent to the at least one button of another one of the pair of control devices forming substantially no space therebetween, wherein the alignment plate is adapted to align the adjacently disposed buttons. According to a further embodiments, the method further comprises the steps of: securing the ganged control devices to an electrical box; and securing a faceplate to the ganged control devices, wherein the faceplate comprises a single opening sized and shaped to receive the buttons of the pair of ganged control devices.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.
Brief Description of the Several Views of the Drawings

DETAILED DESCRIPTION OF THE INVENTION

Figure 1:
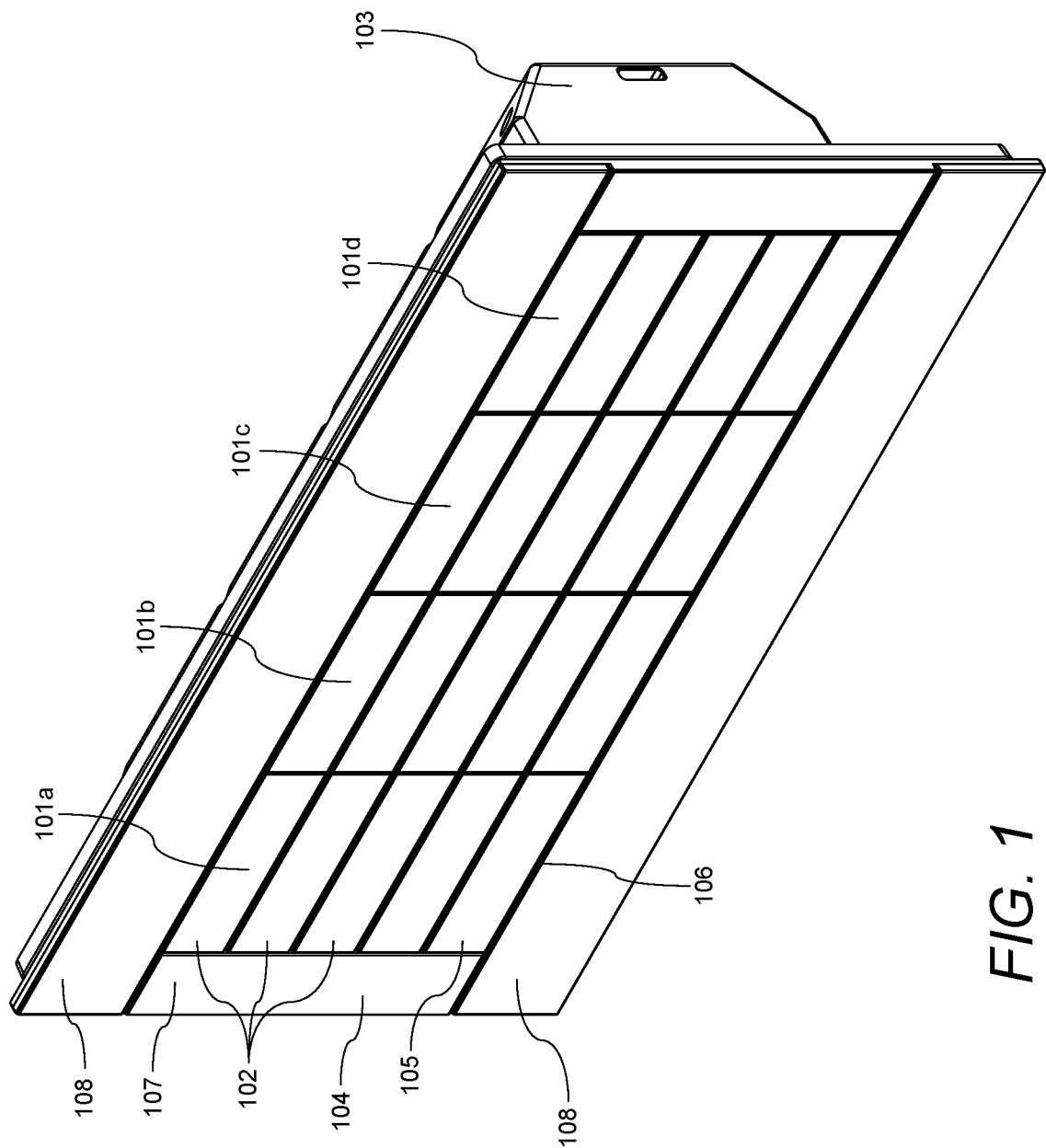
FIG. 1 illustrates a perspective front view of four-ganged control devices according to an illustrative embodiment.

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" or "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.
101 Control Device
101a-d Control Devices
102 Buttons
103 Housing
104 Faceplate
105 Front Surfaces
106 Opening
107 Front Surface
108 Trim Plates
201 Rear Housing Portion
202 Front Housing Portion
206 Side Surfaces
208 Recesses
209 Mounting Bracket
210 Tapered Inner Side Wall
211 Mounting Holes
305 Tactile Switches
308 Front Wall
309 Openings
315 Light Bars
400 Alignment Plate
401 Vertical Wall
402 First Side Surface
403 Second Side Surface
408 Tabs
410 Tapered Outer Side Wall
411 Bumps
412 Rear Edge
700 Distance
701 Rear Wall
801 Control Device
801a-b Control Devices
800 Alignment Plate
802 Buttons
803 Housing
806 Side Surfaces
808 Recesses
810 Tapered Inner Side Wall
811 Vertical Wall
812 First Side Surface
813 Second Side Surface
818 Tabs
819 Tapered Outer Side Wall
820 Projecting Portion
821 Rear Edge

LIST OF ACRONYMS USED IN THE SPECIFICATION IN ALPHABETIC ORDER

The following is a list of the acronyms used in the specification in alphabetical order.
AC Alternating Current
AV Audiovisual
DC Direct Current
HVAC Heating, Ventilation and Air Conditioning
LED Light Emitting Diode
PCB Printed Circuit Board
PoE Power-over-Ethernet Mode(s) for Carrying Out the Invention For 40 years Crestron Electronics, Inc. has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes of the aspects of the embodiments described herein can be manufactured by Crestron Electronics, Inc., located in Rockleigh, N.J.

The different aspects of the embodiments described herein pertain to the context of wall mounted control devices, but are not limited thereto, except as may be set forth expressly in the appended claims. More specifically, aspects of the embodiments relate to an apparatus, system, and method for ganging and aligning a plurality of wall mounted control devices, such as keypads. While a keypad is shown and discussed herein as one wall mounted control device, the wall mounted control devices may also include dimmers, switches, outlets, data jacks, or the like.

Figure 8:
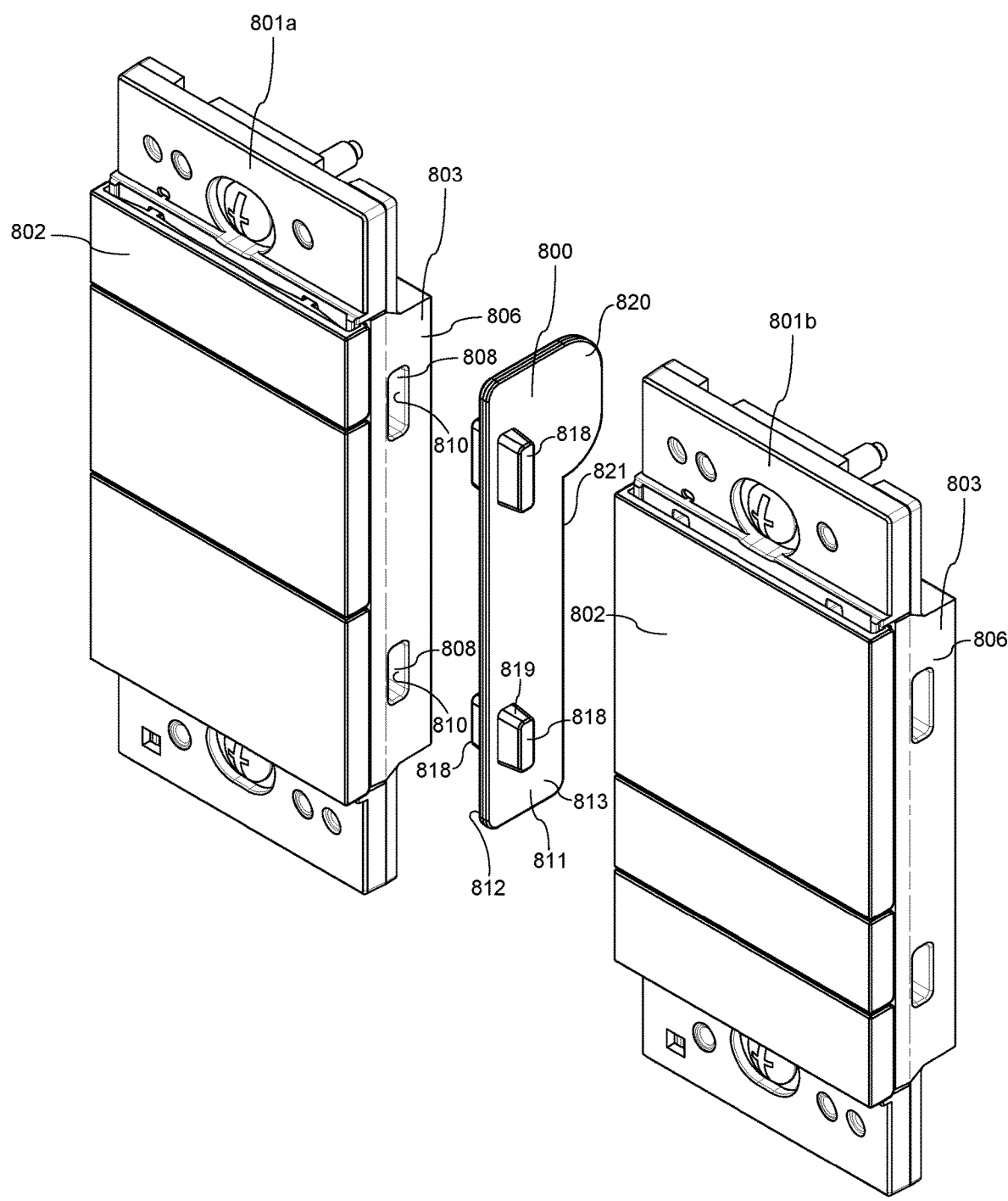
FIG. 8 illustrates an exploded perspective view of a pair of aligned control devices with an alignment plate of another embodiment disposed therebetween according to an illustrative embodiment.

FIG. 1 illustrates a perspective front view of an illustrative four ganged control devices 101a-d according to an illustrative embodiment. The embodiments discussed herein, however, may be used to gang two or more control devices. Each control device 101a-d may serve as a user interface to associated loads or load controllers in a space. According to an embodiment, each control device 101a-d may be configured as a keypad comprising one or more buttons 102, such as five single height buttons 102. Each button 102 may be associated with a particular load and/or to a particular operation of a load. For example, different buttons 102 may correspond to different lighting scenes of lighting loads. Although five buttons 102 are shown for each keypad 101a-d, any other number of buttons, button heights, or button configurations may be used (for example as shown in FIG. 8). In other embodiments, a control device 101a-d may be configured as a lighting switch or a dimmer having a single button that may be used to control an on/off status of the load. Alternatively, or in addition, the single button can be used to control a dimming setting of the load. Each button 102 may comprise indicia disposed thereon to provide clear designation of each button's function. In addition, each button 102 may be backlit, for example via light emitting diodes (LEDs), for visibility and/or to provide status indication of the button 102.

In an illustrative embodiment, each control device 101a-d may be configured to receive control commands directly from a user via buttons 102 and transmit the control command to a load (such as a light, fan, window blinds, etc.) or to a load controller (not shown) electrically connected the load to control an operation of the load based on the control commands. In various aspects of the embodiments, the control devices 101a-d may control various types of electronic devices or loads. Each control device 101a-d may comprise one or more wires or control ports for interfacing with various types of electronic devices or loads, including, but not limited to audiovisual (AV) equipment, lighting, shades, screens, computers, laptops, heating, ventilation and air conditioning (HVAC), security, appliances, and other room devices. The control devices 101a-d may be used in residential load control, or in commercial settings, such as classrooms or meeting rooms.

Figure 2:
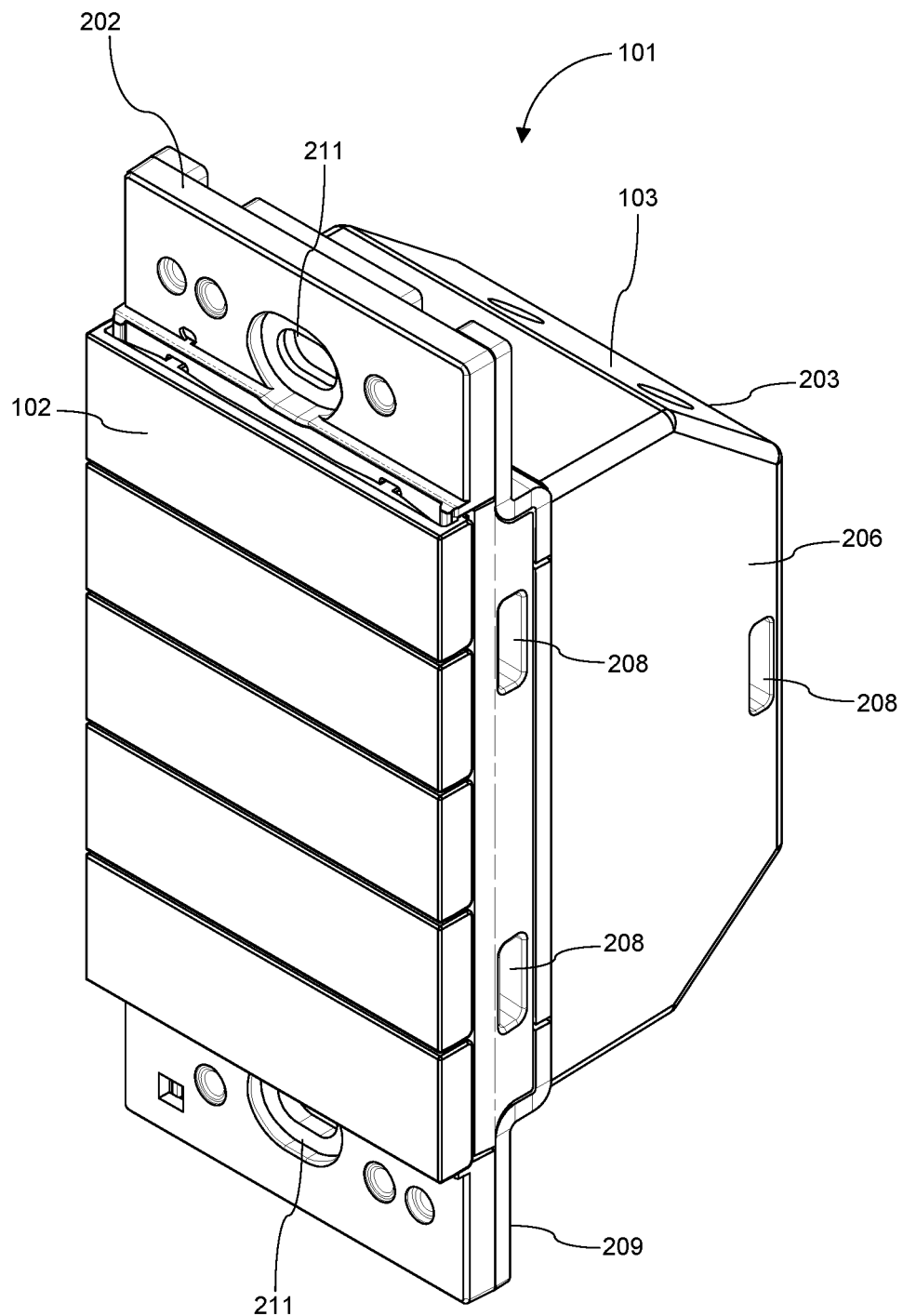
FIG. 2 illustrates a perspective front view of a control device with the faceplate removed according to an illustrative embodiment.

Reference is now made to FIGS. 1 and 2, where FIG. 2 shows the control device 101 with the faceplate 104 removed. Each control device 101 may comprise a housing 103 adapted to house various electrical components of the control device 101, such as the power supply and an electrical printed circuit board (not shown). The housing 103 is further adapted to carry the buttons 102 thereon. The housing 103 may comprise mounting holes 211 for mounting the control device 101 to a standard electrical box via screws. According to another embodiment, control device 101 may be mounted to other surfaces using a dedicated enclosure. According yet to another embodiment, the control device 101 may be configured to sit freestanding on a surface, such as a table, via a table top enclosure.

Referring to FIG. 1, once a plurality of control devices 101a-d are mounted to a wall or an enclosure, the control devices 101a-d may be covered using a faceplate 104. The faceplate 104 may comprise a single opening 106 sized and shaped for receiving the plurality of buttons 102 of the ganged control devices 101a-d therein. The faceplate 104 may be secured to the housing 103 using screws. According to an embodiment, the screws may be covered using a pair of decorative trim plates 108. The trim plates 108 may be removably attached to the top and bottom horizontal walls of the faceplate 104 using magnets (not shown).

According to an embodiment, the front surfaces 105 of the buttons 102 are adapted to be substantially flush with the front surface 107 of the faceplate 104, resulting in a substantially flat overall front surface. In an illustrative embodiment, the buttons 102 and faceplate 104 may be fabricated from plastic, where the particular color of the plastic is selected to aesthetically match an overall installation. In another embodiment, the buttons 102 and faceplate 104 may comprise one color and texture, such as a black, white, or almond plastic, while the trim plates 108 may comprise a different color, material, and/or texture. In this configuration, the trim plates 108 may virtually comprise any type of decorative material, such as metal, glass, wood, fabric, leather, marble, stone, composite materials, or the like.

In addition, the control devices 101a-d of the present embodiments do not comprise a bezel frame that surrounds the buttons 102 as in conventional control devices. In addition, the buttons 102 comprise width that is larger than the width of the housing 103 (as shown in FIG. 2). As such, when a plurality of control devices 101a-d are ganged next to each other a set buttons 102 of one control device 101a are disposed adjacent to a set of buttons 102 of an adjacent control device 101b, such that there is substantially no space between the adjacent sets of buttons 102. A multi gang faceplate 104 of the present embodiments comprises a single opening 106 adapted to accommodate a corresponding number of control devices 101a-d. As such, the multi gang faceplate 104 does not comprise vertical walls between adjacent control devices 101a-d that separate their sets of buttons 102, as in conventional control devices. This beneficially creates an overall substantially flat surface across the plurality of ganged control devices. The flat overall surface and the side by side ganging of the control devices 101a-d of the present embodiments result in an aesthetically pleasing appearance.

Since the side by side sets of buttons 102 are closely disposed, any misalignment of the buttons 102 would be unsightly. As such, according to the present embodiment, a multi-gang alignment plate 400, shown in FIGS. 4A-4D, is used to interconnect and align the side by side control devices 101a-d. According to another embodiment, the multi-gang alignment plate 400 discussed herein may be used to align other types of wall mounted control devices, for example, conventional toggle switches or decorative rocker switches.

Figure 3:
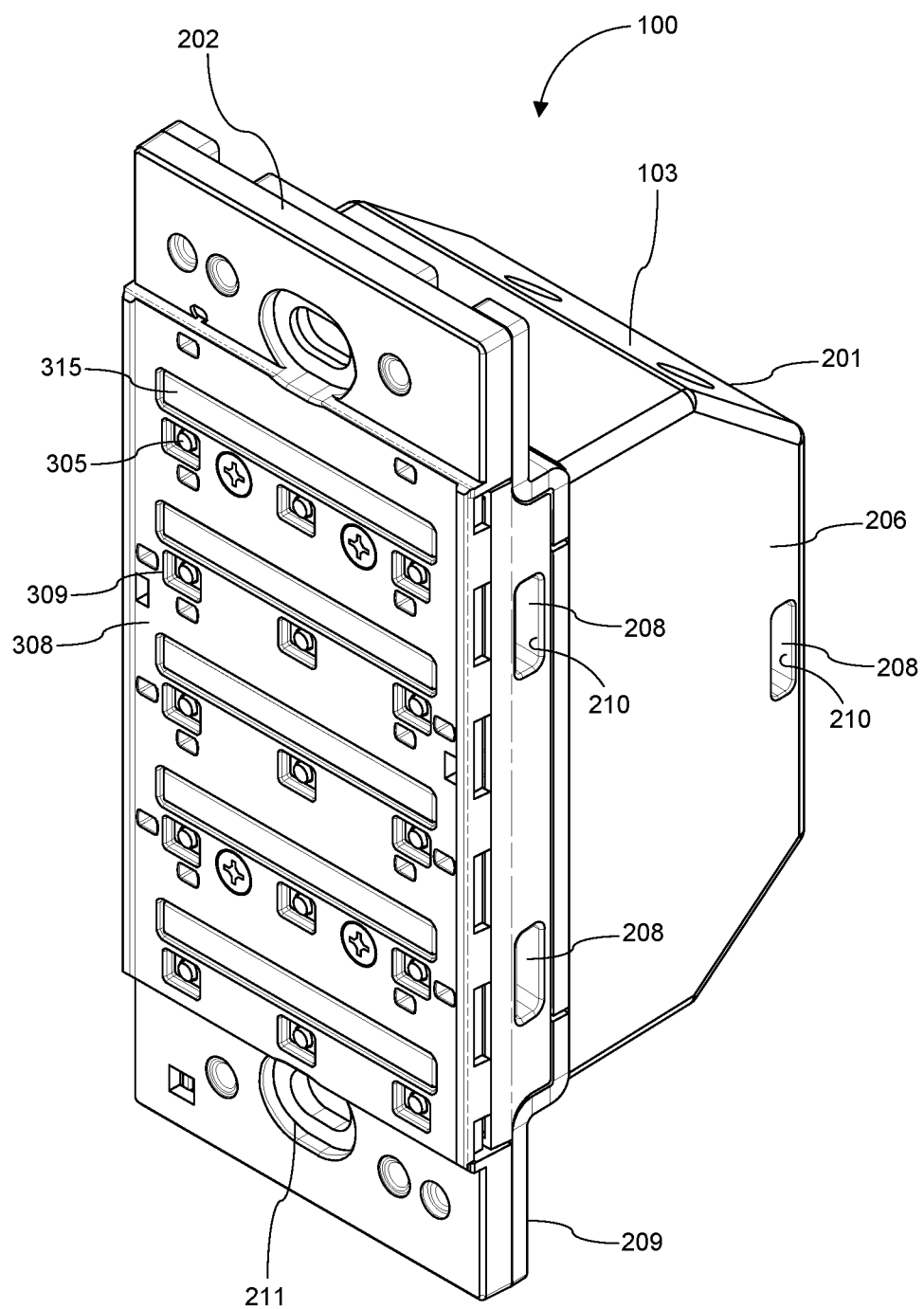
FIG. 3 illustrates a perspective front view of a control device with the buttons removed according to an illustrative embodiment.

Referring to FIG. 3, where the control device 101 is shown with the faceplate 104 and the buttons 102 removed for clarity. According to one embodiment, the housing 103 of each control device 101 may include a front housing portion 202 and a rear housing portion 201, which may comprise one or more parts. According to an embodiment, the rear housing portion 201 may comprise one or more mounting brackets 209 for providing support to housing 103 and comprising the mounting holes 211 for mounting the control device 101 to an electrical box. The rear housing portion 201 may fit within a standard electrical or junction box and may be adapted to contain various electrical components, for example on a printed circuit board (PCB), configured for providing various functionality to the control device 101, including for receiving commands and transmitting commands wirelessly to a load or a load controlling device. The rear housing portion 201 may house a power supply for providing power to the various circuit components of the control device 101.

The front housing portion 202 may be adapted to be secured to the rear housing portion 201 using screws. The front housing portion 202 may comprise a front wall 308 that may include a plurality of openings 309 extending traversely therethrough aligned with and adapted to provide access to various components disposed behind the front wall 308, such as tactile switches 305 and light bars 315 for providing backlighting to buttons 102. According to an embodiment, the buttons 102 are adapted to be secured to the front housing portion 202 (as shown in FIG. 2). Each button 102 may comprise one or more projections extending from its rear wall (not shown) adapted to depress a least one of the tactile switches 305. The buttons 102 may comprise a width wider than the housing 103 and may be adapted to removably attach to the sides of the housing 103 such that they appear to float on the housing 103.

The housing 103 may comprise a pair of oppositely disposed side surfaces 206. Each side surface 206 may comprise a plurality of recesses 208. For example, three recesses 208 may be used—a pair of recesses 208 vertically aligned and disposed proximate to the front of the control device 101 and another recess 208 disposed proximate to the rear of the control device 101. Although other number of recesses 208 may be provided. Each recess 208 traverses and is recessed in a side surface 206 of the housing 103. According to an embodiment, each recess 208 may comprise a tapered inner side wall 210, tapering inwardly from the side surface 206.

Figure 4A:
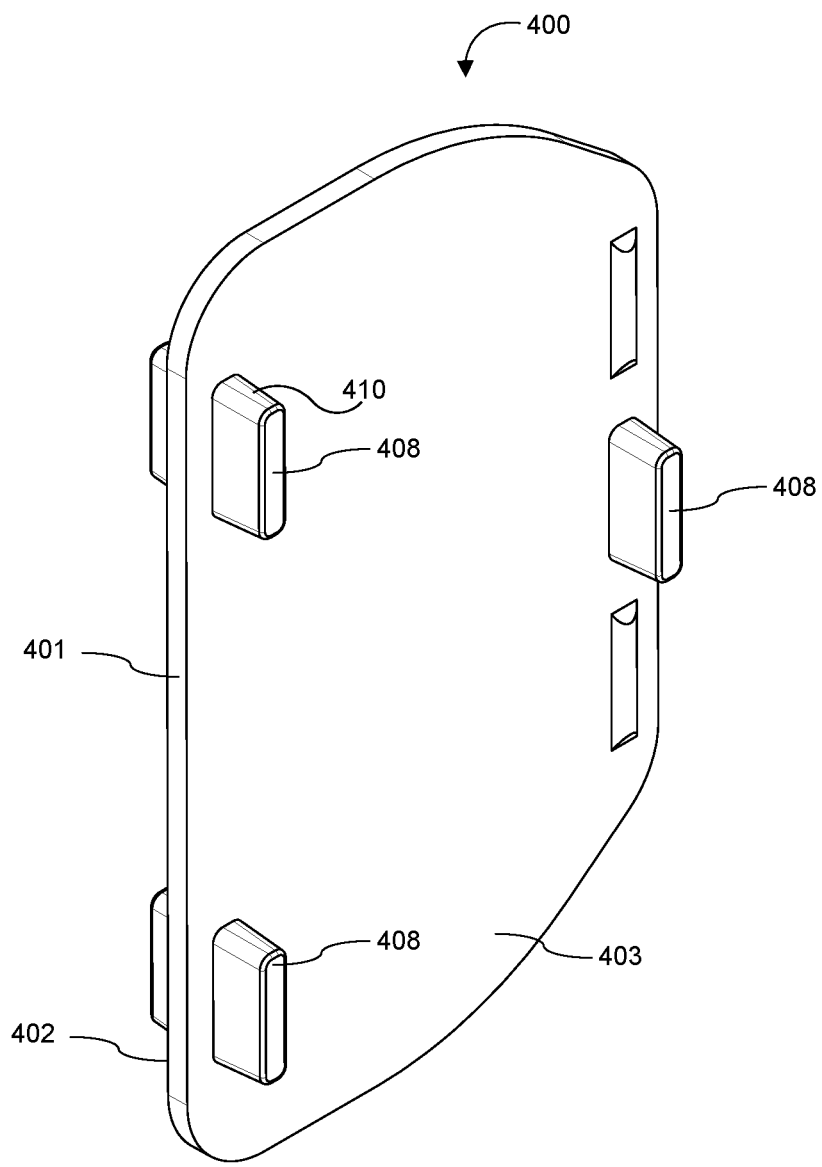
FIG. 4A illustrates a perspective front view of an alignment plate according to an illustrative embodiment.
Figure 4B:
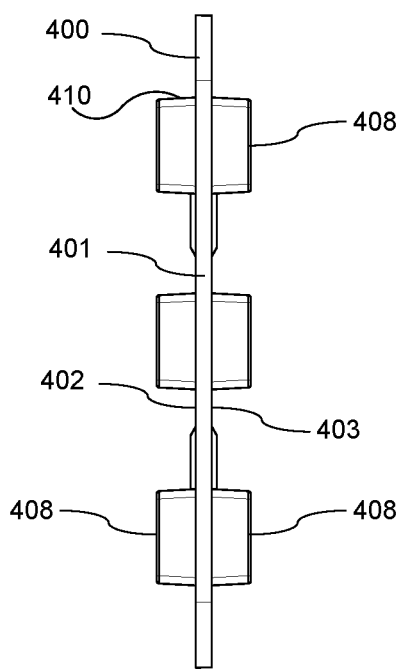
FIG. 4B illustrates a front view of the alignment plate according to an illustrative embodiment.
Figure 4C:
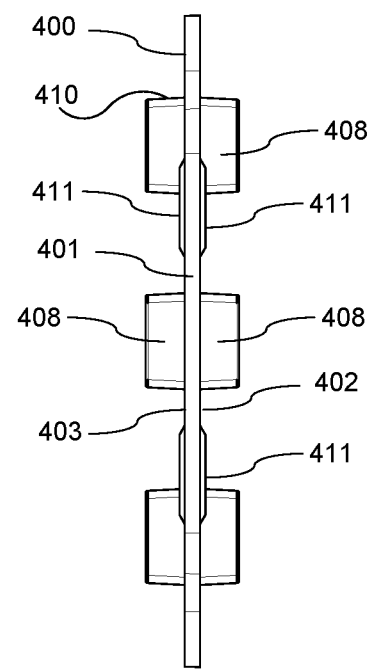
FIG. 4C illustrates a rear view of the alignment plate according to an illustrative embodiment.
Figure 4D:
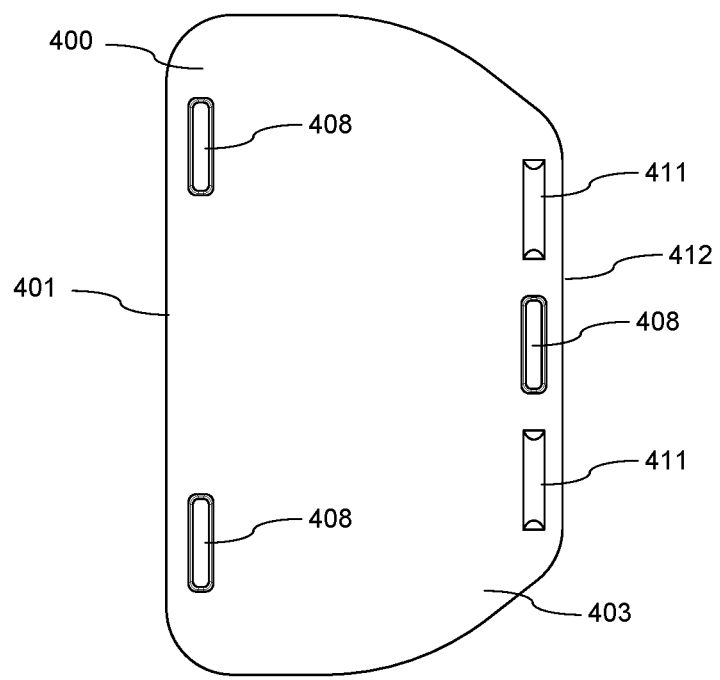
FIG. 4D illustrates a side view of an alignment plate according to an illustrative embodiment.

Referring to FIGS. 4A-4D, where FIG. 4A illustrates a front perspective view of the alignment plate 400, FIG. 4B illustrates a front view of the alignment plate 400, FIG. 4C illustrates a rear view of the alignment plate 400, and FIG. 4D illustrates a right side view of the alignment plate 400, wherein the left side view is a mirror image thereof. Each alignment plate 400 may comprise a vertical wall 401 sized and shaped to substantially correspond to the shape of one of the side surfaces 206 of the control device housing 103. According to various embodiment, alignment plate 400 may comprise plastic, metal, composite or other materials known in the art. The vertical wall 401 of alignment plate 400 may comprise a first side surface 402 and an oppositely disposed second side surface 403. The alignment plate 400 may further comprise a plurality of tabs 408 traversely extending from each of the first and second side surfaces 402 and 403 of the alignment plate 400. These tabs 408 are sized, shaped, and positioned for cooperating and mating with the recesses 208 in the side surfaces 206 of the control device 101. According to an embodiment, the first side surface 402 may comprise three tabs 408, and the second side surface 403 may comprise three tabs 408 oppositely disposed from and aligned with the tabs 408 on the first side surface 402. According to an embodiment, as better shown in FIGS. 4B and 4C, each tab 408 may comprise a tapered outer side wall 410, tapering inwardly from the side surfaces 402 or 403. When a tab 408 of the alignment plate 400 is inserted within one of the recesses 208 of the control device housing 103, the tapered outer side wall 410 of the tab 408 is used to form a friction fit with the tapered inner side wall 210 of the recess 208 such that the tab 408 is firmly engaged within the recess 208. In addition, the tapered walls 210 and 410 of the recesses 208 and tabs 408, respectively, are used to assist the insertion of the tab 408 into a recess 208 in the control device housing 103.

According to an embodiment, each first and second side surfaces 402 and 403 of the vertical wall 401 of the alignment plate 400 further comprise a pair of bumps 411 disposed thereon. The bumps 411 may be disposed near the rear edge 412 of the vertical wall 401 of the alignment plate 400 above and below the rear tab 408.

Figure 5:
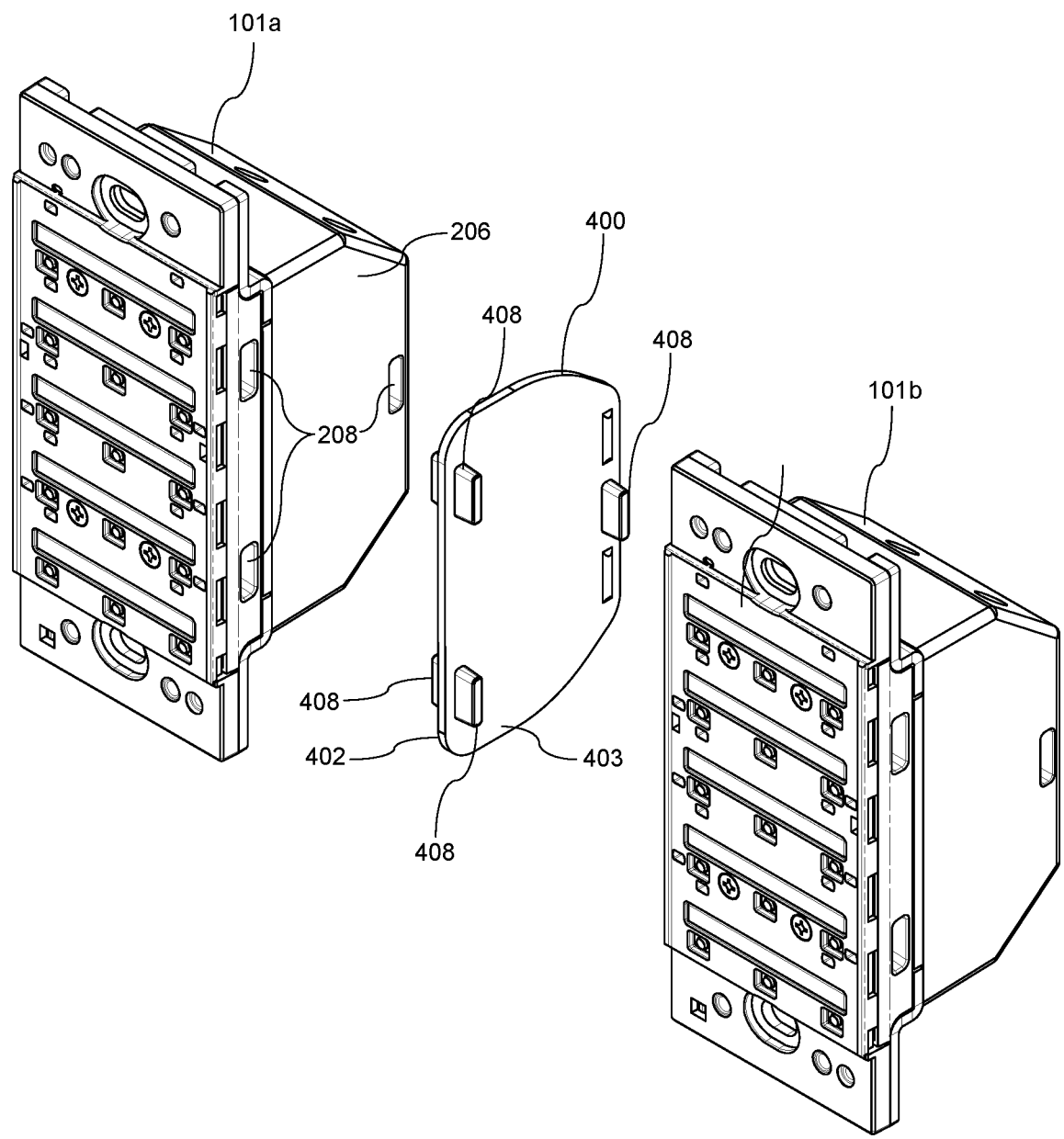
FIG. 5 illustrates an exploded perspective view of a pair of aligned control devices with the alignment plate disposed therebetween according to an illustrative embodiment.

As shown in FIG. 5, during installation, any pair of control devices 101a and 101b may be attached and aligned with one another by securing the alignment plate 400 between the control devices 101a-b. Particularly, the first side surface 402 of the vertical wall 401 of the alignment plate 400 may be secured to a side surface 206 of one of the control devices 101a by inserting the tabs 408 disposed on the first side surface 402 of the alignment plate 400 into the recesses 208 in the side surface 206 of the control device 101a. The second side surface 403 of the alignment plate 400 may be secured to a side surface 206 of the second one of the control devices 101b by inserting the tabs 408 disposed on the second side surface 403 of the alignment plate 400 into the recesses 208 in the side surface 206 of the control device 101b. Pressure may then be applied to the pair of control devices 101a and 101b toward each other such that they are secured by the alignment plate 400. As discussed above, the tapered outer side wall 410 of each tab 408 on the alignment plate 400 is adapted to form a friction fit with the tapered inner side wall 210 of a corresponding recess 208 in a side surface 206 of housing 103 of control device 103. As such, the tabs 408 may be pressed into corresponding recesses 208 in the control device 101 by an installer, such that the alignment plate 400 is secured to and does not easily disengage from the control device 101.

Figure 6:
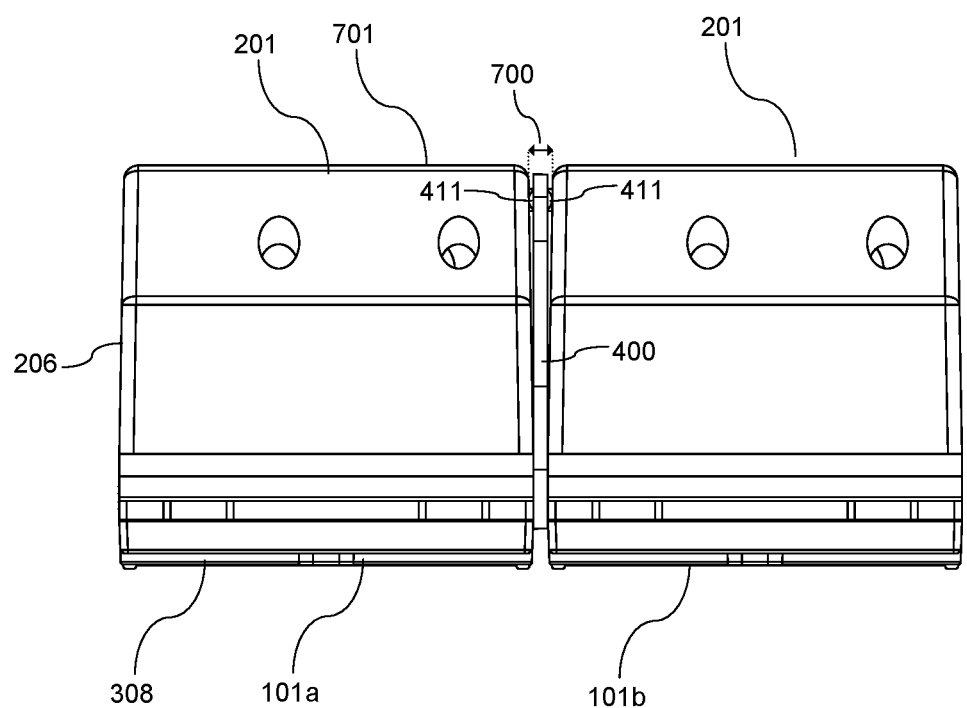
FIG. 6 illustrates a top view of a pair of control devices connected and aligned via the alignment plate according to an illustrative embodiment.

Referring now to FIG. 6, which shows a top view of two connected control devices 101a and 101b. To better fit within a standard electrical box, the side surfaces 206 of housing 103 of the control device 101 may be tapered such that the rear wall 701 of the housing 103 is narrower than the front wall 308 of the housing 103. As a result, when two adjacently disposed control devices 101a-b are interconnected via an alignment plate 400, the side surfaces 206 of the control devices 101a-b become flush with the side surfaces 402 and 403 of the alignment plate 400 at the front portion of the housing 103. However, the side surfaces 206 of the control devices 101a-b are separated by a distance 700 from each other at the rear portion of the housing 103 that is wider than the vertical wall 401 of the alignment plate 400 such that the side surfaces 206 of the control devices 101a-b do not contact the side surfaces 402 and 403 of the alignment plate 400. To compensate for this distance 700 between the housing 103 of the control devices 101a-b, the bumps 411 on the rear portion of the alignment plate 400 are used to abut the side surfaces 206 of the control devices 101a-b at the rear portion of the housing 103.

Figure 7:
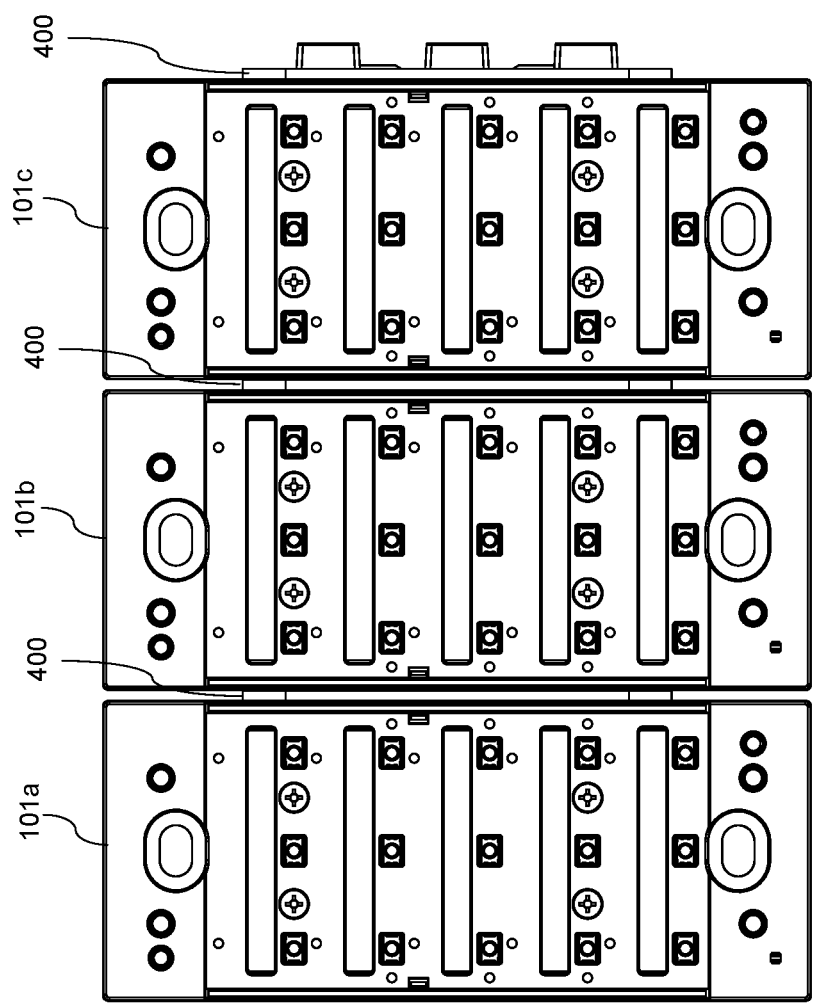
FIG. 7 illustrates a front view of three keypads connected and aligned via the alignment plate according to an illustrative embodiment.

Additional control devices 101 may be added to this assembly by including additional alignment plates 400. For example, FIG. 7 illustrates a front view of three control devices 101a-d interconnected and aligned via two alignment plates 400 according to an illustrative embodiment.

After ganging a desired number of control devices 101 together via the alignment plate 400, the ganged assembly may be inserted into an electrical box. The control devices 101 may be secured to the electrical box by inserting screws (not shown) through mounting holes 211. The ganged assembly can then be covered using a multi gang faceplate 104.

Referring to FIG. 8, there is shown a front perspective view of another configuration of a pair of wall mounted control devices 801a and 801b and alignment plate 800. Each control device 801 comprises a low profile housing 803, compared to housing 103 of control devices 101. A low profile housing is typically utilized in control devices that do not require power supplies capable of connecting to alternating current (AC) mains power source. Control devices 801a-b may be battery operated or may be powered via low voltage direct current (DC) power source. In an embodiment, control devices 801a-b may comprise flying leads to connect to 0-10V wires. In yet another embodiment, control devices 801a-b may be powered using Power-over-Ethernet (PoE) and may comprise a PoE interface, such as via a Cresnet® port. Cresnet® provides a network wiring solution for Creston® keypads, lighting controls, thermostats, and other devices. The Cresnet® bus offers wiring and configuration, carrying bidirectional communication and 24 VDC power to each device over a simple 4-conductor cable. However, other types of connections or ports may be utilized.

Housing 803 may comprise two oppositely disposed side surfaces 806 each comprises a plurality of recesses 808. For example, a pair of vertically aligned recesses 808 may be provided, each traversing and is recessed in a side surface 806 of the housing 803. Although other number of recesses 808 may be used. According to an embodiment, each recess 808 may comprise a tapered inner side wall 810, tapering inwardly from the side surface 806.

According to an embodiment, a low profile alignment plate 800 may be utilized to interconnect and align control devices 801a and 801b comprising a narrow vertical wall 811. The vertical wall 811 may be sized and shaped to substantially correspond to the shape of the side surfaces 806 of the control device housing 803. The alignment plate 800 may further comprise tabs 818 traversely extending from each of the first and second side surfaces 812 and 813 of the alignment plate 800. These tabs 818 are sized, shaped, and positioned for cooperating with the recesses 808 in the side surfaces 806 of the control device 801. According to an embodiment, each side surface 812 and 813 may comprise a pair of vertically aligned tabs 818.

According to another embodiment, the narrow alignment plate 800 may be used instead of alignment plate 400 to interconnect and align the control devices 101a and 101b shown in FIG. 5. As such, instead of having three recesses 208 in side surfaces 206 of the control devices 101a-b, two vertically aligned recesses 208 may be used—sized, shaped, and positioned for cooperating with tabs 818 of the alignment plate 800.

Figure 9A:
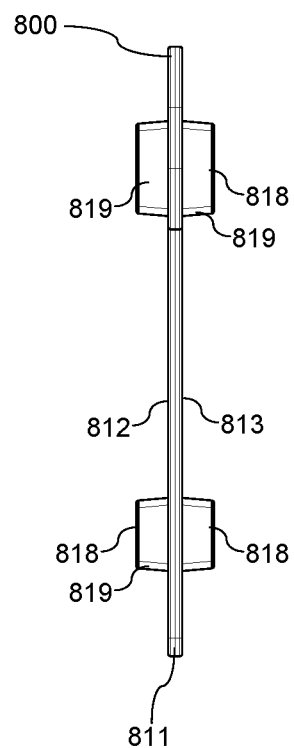
FIG. 9A illustrates a rear view of the alignment plate of another embodiment according to an illustrative embodiment.

Referring to FIGS. 8 and 9A, according to an embodiment each tab 818 may comprise a tapered outer side wall 819, tapering inwardly from the side surfaces 812 and 813. When a tab 818 of the alignment plate 800 is inserted within one of the recesses 808 of the control device housing 803, the tapered outer side wall 819 of the tab 818 is used to form a friction fit with the tapered inner side wall 810 of the recess 808 such that the tab 818 is firmly engaged within the recess 808.

Figure 9B:
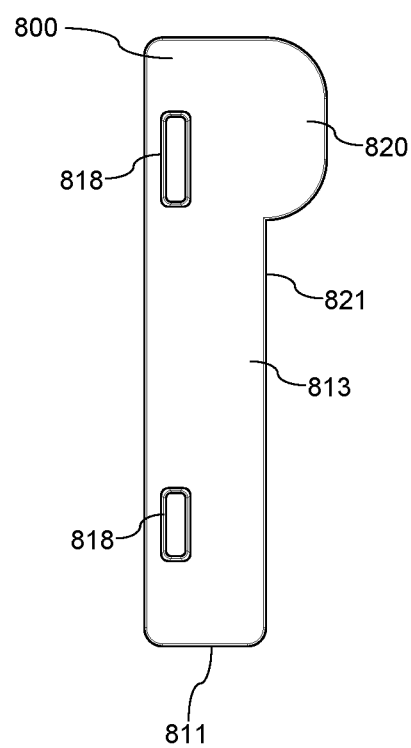
FIG. 9B illustrates a side view of the alignment plate of another embodiment according to an illustrative embodiment.

According to one embodiment, all tabs 818 and recesses 808 (as well as tabs 408 and recesses 208) may comprise substantially the same mating size, such as width and length (as shown in FIG. 5). According to another embodiments, each pair of corresponding tabs 818 and recesses 808 (as well as tabs 408 and recesses 208) may comprise different sizes. For example, referring to FIGS. 8 and 9A-9B, the upper tab 818, and thereby the upper recess 808, may comprise a longer length than the lower tab 818, and thereby the lower recess 808. The size of the tabs and recesses may be used to dictate the orientation of the alignment plate 800 with respect to the control devices 801.

In addition, the vertical wall 811 of the alignment plate may comprise a projecting portion 820 projecting from the rear edge 821 of the alignment plate 800. Projecting portion 820 may be provided to provide gripping surface to the user when the alignment plate 800 is installed or removed. For example, referring to FIG. 10, projecting portion 820 may be gripped to dislodge alignment plate 800 from the control devices 801a-b.

Figure 10:
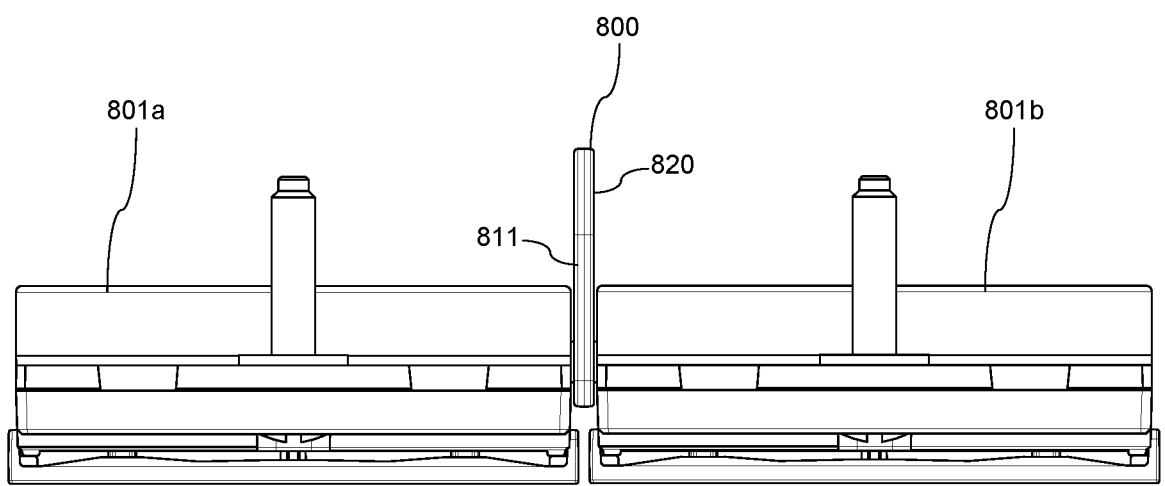
FIG. 10 illustrates a top view of a pair of control devices connected and aligned via the alignment plate of another embodiment according to an illustrative embodiment.

As shown in FIG. 10, during installation, any pair of control devices 801a-b may be attached and aligned with one another by securing the alignment plate 800 between the control devices 801a-b by inserting the tabs 818 of the alignment plate 800 in corresponding recesses 808 of a pair of adjacent control devices 801a-b. Additional control devices 801 may be added to this assembly by including additional alignment plates 800 as discussed above.

INDUSTRIAL APPLICABILITY

The disclosed embodiments provide an apparatus, system, and method for aligning a plurality of wall mounted control devices. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

Additionally, the various methods described above are not meant to limit the aspects of the embodiments, or to suggest that the aspects of the embodiments should be implemented following the described methods. The purpose of the described methods is to facilitate the understanding of one or more aspects of the embodiments and to provide the reader with one or many possible implementations of the processed discussed herein. The steps performed during the described methods are not intended to completely describe the entire process but only to illustrate some of the aspects discussed above. It should be understood by one of ordinary skill in the art that the steps may be performed in a different order and that some steps may be eliminated or substituted.

All United States patents and applications, foreign patents, and publications discussed above are hereby incorporated herein by reference in their entireties.

Alternate Embodiments

Alternate embodiments may be devised without departing from the spirit or the scope of the different aspects of the embodiments.

What is claimed is:

1. An assembly of ganged control devices comprising:
a pair of adjacently positioned control devices each adapted to control at least one function of at least one associated load, wherein each control device comprises a housing assembly and at least one button attached to the housing assembly, wherein the housing assembly comprises a pair of oppositely disposed side surfaces each comprising a plurality of recesses; and
an alignment plate comprising a vertical wall adapted to be positioned in between the pair of control devices and a plurality of tabs traversely extending from oppositely disposed side surfaces of the vertical wall, wherein the tabs are sized, shaped, and positioned for mating with the recesses in the side surfaces of the pair of control devices to removably attach and align the pair of control devices;
wherein each side surface of the vertical wall of the alignment plate further comprise at least one bump extending therefrom in proximity to a rear edge of the vertical wall to compensate for a space created between the housing assemblies of the pair of adjacent control devices.

2. The assembly of claim 1, wherein the plurality of recesses on each side surface of each control device comprise a pair of vertically aligned recesses, and wherein the plurality of tabs on each side surface of the alignment plate comprise a pair of vertically aligned tabs.

3. The assembly of claim 2, wherein the pair of vertically aligned recesses are disposed proximate to a front side of each control device, wherein each control device further comprises a third recess disposed proximate to a rear side of each control device, and wherein each side surface of the alignment plate further comprises a third tab positioned for mating with the third recess on a corresponding side surface of a corresponding control device.

4. The assembly of claim 1, wherein each recess comprises a tapered inner side wall and wherein each tab comprises a tapered outer side wall adapted to form a friction fit with the tapered inner side wall of a corresponding recess.

5. The assembly of claim 1, wherein the alignment plate is adapted to removably attach the pair of adjacently positioned control devices by having the plurality of tabs press fit into corresponding recesses in the control devices.

6. The assembly of claim 1, wherein the vertical wall of the alignment plate is sized and shaped to substantially correspond to a size and shape of one of the side surfaces of the control devices.

7. The assembly of claim 1, wherein at least one button of one of the pair of control devices is adapted to be disposed adjacent to at least one button of another one of the pair of control devices forming substantially no space therebetween, wherein the alignment plate is adapted to align the adjacently disposed buttons.

8. The assembly of claim 7 further comprising a faceplate comprising a single opening sized and shaped to receive the buttons of the pair of adjacently disposed control devices.

9. The assembly of claim 8, wherein a front surface of each button is adapted to be substantially flush with a front surface of the faceplate.

10. The assembly of claim 1, wherein the plurality of tabs comprise a substantially equal size that mate with the plurality of recesses that comprise a substantially equal size.

11. The assembly of claim 1, wherein at least one tab comprises a different size from the plurality of tabs that mates with at least one recess that comprises a different size from the plurality of recesses.

12. The assembly of claim 1, wherein the vertical wall of the alignment plate comprises a projecting portion projecting from a rear edge of the vertical wall adapted to provide a gripping surface.

13. The assembly of claim 1 further comprising at least one additional control device adapted to be removably attached to and aligned with the pair of control devices via at least one additional alignment plate.

14. An assembly of ganged control devices comprising:
a pair of adjacently positioned control devices each adapted to control at least one function of at least one associated load, wherein each control device comprises a housing assembly and at least one button attached to the housing assembly, wherein the housing assembly comprises a pair of oppositely disposed side surfaces each comprising a pair of vertically aligned recesses, wherein each recess comprises an inner side wall that tapers inwardly from the side surface of the respective control device; and
an alignment plate comprising a vertical wall adapted to be positioned in between the pair of control devices and a pair of vertically aligned tabs traversely extending from oppositely disposed side surfaces of the vertical wall, wherein each tab comprises an outer side wall that tapers inwardly from the respective side surface of the vertical wall of the alignment plate, wherein the tabs are sized, shaped, and positioned to be inserted into corresponding recesses such that the tapered outer side walls of the tabs form a friction fit with the tapered inner side walls of the recesses to removably attach and align the pair of control devices.

15. The assembly of claim 14, wherein the pair of recesses comprise a pair of different sizes and wherein the pair of tabs comprise a pair of different sizes that complement the different sizes of the pair of recesses.

16. A method for ganging at least a pair of control devices each adapted to control at least one function of at least one associated load, the method comprising the steps of:
inserting a plurality of tabs that traversely extend from a first side surface of a vertical wall of an alignment plate into a plurality of recesses formed on a side surface of a housing assembly of a first control device;
inserting a plurality of tabs that traversely extend from a second side surface of the vertical wall of the alignment plate into a plurality of recesses formed on a side surface of a housing assembly of a second control device;
wherein each recess comprises an inner side wall that tapers inwardly from the side surface of the respective control device, wherein each tab comprises an outer side wall that tapers inwardly from the respective side surface of the vertical wall of the alignment plate; and
applying pressure to the pair of control devices toward each other such that the tapered outer side walls of the tabs on the alignment plate form a friction fit with the tapered inner side walls of the respective recesses of the pair of control devices to removably secure the pair of control devices to the alignment plate.

17. The method of claim 16, wherein each control device comprises at least one button attached to the housing assembly, wherein the at least one button of one of the pair of control devices is adapted to be disposed adjacent to the at least one button of another one of the pair of control devices forming substantially no space therebetween, wherein the alignment plate is adapted to align the adjacently disposed buttons.

18. The method of claim 16 further comprising the steps of:
securing the ganged control devices to an electrical box; and
securing a faceplate to the ganged control devices, wherein the faceplate comprises a single opening sized and shaped to receive the buttons of the pair of ganged control devices.

* * * * *